(12) United States Patent
D'Angelo

(10) Patent No.: US 9,577,610 B2
(45) Date of Patent: Feb. 21, 2017

(54) ACTIVE LED VOLTAGE CLAMP

(75) Inventor: Kevin Peter D'Angelo, Carmel, CA (US)

(73) Assignee: ADVANCED ANALOGIC TECHNOLOGIES INCORPORATED, San Jose, CA (US)

( * ) Notice: Subject to any disclaimer, the term of this patent is extended or adjusted under 35 U.S.C. 154(b) by 383 days.

(21) Appl. No.: 13/080,136

(22) Filed: Apr. 5, 2011

(65) Prior Publication Data

US 2013/0300293 A1 Nov. 14, 2013

(51) Int. Cl.
*H05B 33/08* (2006.01)
*H03K 3/012* (2006.01)

(52) U.S. Cl.
CPC ......... *H03K 3/012* (2013.01); *H05B 33/0815* (2013.01); *H05B 33/0818* (2013.01); *Y02B 20/341* (2013.01)

(58) Field of Classification Search
CPC . H05B 33/0815; H05B 33/0818; H03K 3/012
USPC .................... 315/122; 327/109, 122
See application file for complete search history.

(56) References Cited

U.S. PATENT DOCUMENTS

| | | | |
|---|---|---|---|
| 5,923,152 A | 7/1999 | Guerrera | |
| 6,271,651 B1 | 8/2001 | Stratakos et al. | |
| 6,864,641 B2 | 3/2005 | Dygert | |
| 7,115,888 B2 * | 10/2006 | Hachiya | H05B 33/0815 250/552 |
| 7,116,086 B2 | 10/2006 | Burgyan et al. | |
| 7,235,954 B2 * | 6/2007 | Murakami | 323/222 |
| 7,777,704 B2 | 8/2010 | S et al. | |
| 7,990,119 B2 | 8/2011 | Petty | |
| 8,179,051 B2 | 5/2012 | Zhao | |
| 8,531,164 B2 | 9/2013 | D'Angelo | |
| 2003/0090246 A1 | 5/2003 | Shenai et al. | |
| 2004/0135522 A1 * | 7/2004 | Berman et al. | 315/291 |
| 2006/0028150 A1 * | 2/2006 | Vitunic et al. | 315/248 |
| 2006/0108933 A1 * | 5/2006 | Chen | 315/86 |
| 2008/0258636 A1 * | 10/2008 | Shih et al. | 315/185 R |
| 2009/0102444 A1 | 4/2009 | Nonaka | |
| 2009/0108776 A1 * | 4/2009 | Zhao | 315/307 |

(Continued)

FOREIGN PATENT DOCUMENTS

| | | | |
|---|---|---|---|
| JP | 2010092676 A | * 4/2010 | |
| WO | 2007096868 A1 | 8/2007 | |
| WO | WO2007/096868 | * 8/2007 | H05B 33/08 |

OTHER PUBLICATIONS

Texas Instrumants, Synchronous Buck Converter Design Using TPS56xx Controllers in SLVP10x EVMs User Guide, Sep. 1998.*

*Primary Examiner* — Dedei K Hammond
(74) *Attorney, Agent, or Firm* — Lando & Anastasi, LLP

(57) ABSTRACT

An active clamp current sink is used to voltage protect a low voltage rated, high power current sink that drives illumination current through a string of serially connected LEDs. When the LEDs are turned off as part of a PWM configuration, the forward voltage on the LEDs falls, and the voltage presented to the low voltage rated, high power current sink rises. The active clamp current sink monitors the voltage across the high power current sink and ensures that an adequate current flows through the LEDs. This minimally adequate current maintains a sufficiently large forward voltage through the LEDs, and therefore a sufficiently small voltage is presented to the high power current sink.

18 Claims, 7 Drawing Sheets

(56) References Cited

U.S. PATENT DOCUMENTS

| | | | |
|---|---|---|---|
| 2009/0128045 A1* | 5/2009 | Szczeszynski et al. .. | 315/185 R |
| 2009/0187925 A1* | 7/2009 | Hu et al. ................ | 719/327 |
| 2009/0206808 A1 | 8/2009 | Wrathall | |
| 2009/0230881 A1 | 9/2009 | Chen et al. | |
| 2010/0019751 A1 | 1/2010 | Chen et al. | |
| 2010/0045210 A1* | 2/2010 | Hariharan ............ | 315/297 |
| 2010/0066257 A1 | 3/2010 | Lin et al. | |
| 2010/0156315 A1 | 6/2010 | Zhao et al. | |
| 2010/0201278 A1 | 8/2010 | Zhao | |
| 2011/0089854 A1* | 4/2011 | Yang .............. | H05B 33/0815 315/291 |
| 2011/0175532 A1* | 7/2011 | Peng .............. | H05B 33/0815 315/119 |
| 2011/0221346 A1* | 9/2011 | Lee ................ | H05B 33/0812 315/122 |
| 2013/0293208 A1 | 11/2013 | D'Angelo | |
| 2013/0300293 A1 | 11/2013 | D'Angelo | |
| 2013/0313996 A1 | 11/2013 | Williams | |
| 2014/0042997 A1 | 2/2014 | D'Angelo | |

\* cited by examiner

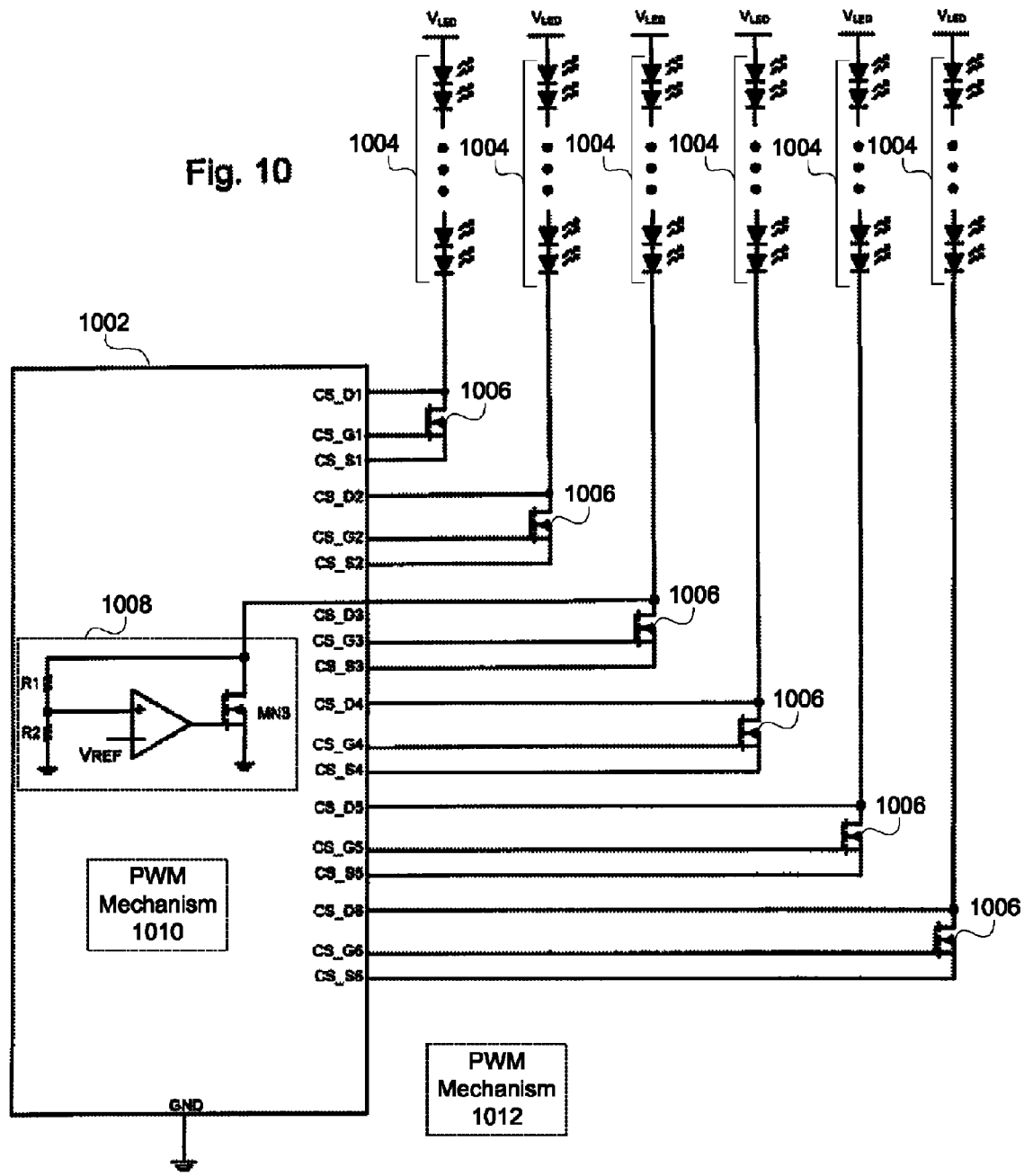

ACTIVE LED VOLTAGE CLAMP

RELATED APPLICATIONS

The inventions described in this document are related to the inventions of U.S. patent application Ser. No. 12/611,870 entitled "Voltage Converting LED Circuit with Switched Capacitor Network" and U.S. patent application Ser. No. 12/611,853 "Multiple Chip Voltage Feedback Technique for Driving LED's". These related patent applications are incorporated in this disclosure by reference.

BACKGROUND OF THE INVENTION

Modern televisions with LED backlights have tended towards longer strings of serially connected LEDs that are controlled as one circuit. These strings, containing from 10 to 40 LEDs, can require voltages between 30 and 150 volts in order to operate effectively. In such strings, the current is regulated in order to control the color of the individual LEDs—more current tends to yield a cooler color of white, while less current tends to yield a warmer color. In order to control the color spectrum of the output, the current is held constant while the brightness is controlled using a PWM on/off mechanism—more time on yields a brighter screen The current through these strings is typically controlled by a low voltage, high power current sink connected from the cathode of the LED string to ground. The high power current sink is cycled on and off at a given PWM duty cycle by a controller within the television, resulting in a brighter or darker screen. Such a basic circuit is shown in FIG. 1.

A problem arises when the high power current sink cycles off and the current through the LED string 102 stops flowing. When this occurs, the forward voltages of the individual LEDs in the string each shrink to zero, and the forward voltage of the serially connected LED string also approaches zero. As a result, the high power current sink 104 and the integrated circuit that contains and/or controls the high power current sink 104 are presented with most of the voltage of the voltage source required to drive the LED string. This high voltage can damage the high power current sink 104 and the integrated circuit.

To protect this circuitry, which is generally comprised of devices with lower voltage ratings than the LED supply voltage, current implementations of these circuits use a device with a high voltage rating inserted in series between the cathode of the series LEDs 202 and the low voltage current sink 206; such a configuration is shown in FIG. 2.

In this figure, the voltage $V_{gate}$ must be greater than the dropout voltage of the current sink plus the high voltage MOSFET 204 threshold voltage. The voltage of $V_{gate}$ must be less than the voltage rating of the current sink plus the high voltage MOSFET 204 threshold voltage. $V_{gate}$ is typically a fixed supply. 24 v is a typical supply available in TV systems and can be used as $V_{gate}$ either directly or voltage divided down using a resistor divider.

FIG. 3 shows this prior art as a 6 channel integrated circuit 302. In this drawing, the MOSFETs depicted in the lower, descending row are discrete components of the high power current sinks 304; in this implementation, they have been removed from the primary IC in order to aid in heat dissipation. The MOSFETs depicted in the upper row are the high voltage MOSFETs 306 that protect both the circuitry of the integrated circuit as well as the high power current sink MOSFETs 304 from voltage of the power supply.

The external, high voltage MOSFETs 306 present a few disadvantages. The devices add cost, both the actual cost of the device and the cost of the implementation of the device within the television or any other enclosing appliance. In addition, the MOSFETs also add wasteful power dissipation to the system, as the current used to power the LED strings must flow through the high voltage device (and its associated voltage drop) on its way to the high power current sink.

SUMMARY OF THE INVENTION

This invention eliminates the external, high voltage series device by taking advantage of the fact that a very small amount of current can greatly increase the forward voltage of an LED or the forward voltage of a string of serially connected LEDs.

An active clamp current sink monitors the voltage across the high power current sink that is located beneath and powers an LED string. When the voltage rises above a predetermined level, the active clamp current sink alters the resistance of a MOSFET by altering its gate voltage. This altered resistance allows current to flow through the LEDs, the MOSFET, and the active clamp current sink, maintaining a minimum forward voltage through the LEDs.

This forward voltage characteristic is shown for a single LED in FIG. 4, an IV characteristic graph taken from laboratory measurements. In this graph, an LED drawing a typical 100 mA of current (typical for an LED that is switched on and producing light) has a forward voltage of about 3.8 volts. FIG. 4 also indicates that a small amount of current (~1 uA) can result in an appreciable forward voltage of approximately 2 volts.

FIG. 5 shows the same analysis for serially connected strings of 30 and 40 LEDs. In the case of the same 100 mA of current, forward voltages of approximately 112 volts and 150 volts are expected. If it is assumed that 100 mA of current is the desired level in order to obtain the correct color and luminosity output from the LEDs, a fixed voltage solution for the 30 LED string would be a 116 volt DC power supply. For the 40 LED string, a 154 volt power supply could be used.

Some modern televisions with LED backlights include feedback mechanisms that regulate the supply voltage. In such a scheme, the regulation examines the voltages across the various high power current sinks, and provides only enough supply voltage to ensure that the high power current sinks are adequately powered. For example, if a one string television's LED string had a forward voltage of 111 volts at 100 mA, and the high power current sink required 1 volt to operate, the supply voltage could be regulated to 112 volts rather than 116 volts, thus conserving 4 volts that would be otherwise dissipated across the current sink. In a two string television with forward voltages of 111 and 113 volts, the supply voltage could be regulated to 114 volts, therefore dissipating 2 volts and 1 volt respectively across the two LED strings.

One tradeoff of the invention is that a small portion of current is required to flow in order to maintain the forward voltage. This current could be as little as 0.1% or much as 10% of the "normal" current when the LEDs are illuminated, but varies according the length of the string and the voltage tolerance of the low voltage current sink.

BRIEF DESCRIPTION OF THE DRAWINGS

FIG. 10 is a schematic of one embodiment's backlight control circuit.

DETAILED DESCRIPTION OF THE PREFERRED EMBODIMENTS

Figure 7:
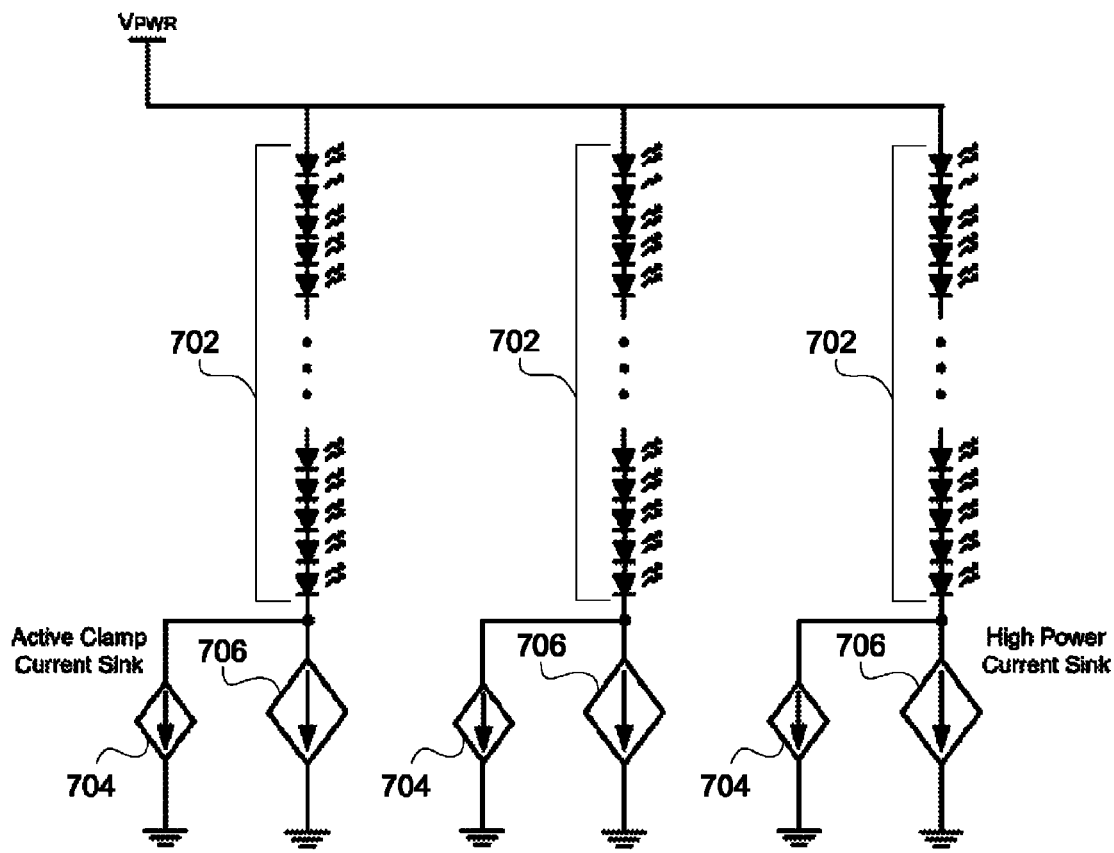
FIG. 7 is a schematic of an embodiment of the invention driving three strings of LEDs.

FIG. 7 shows an embodiment of the invention as it would appear in an enclosing television. Both current sinks associated with each LED string 702 provide a mechanism for driving current through the LED string, the active clamp current sink 704 shown indented to the left of each string and the high power current sink 706 shown underneath each string in each of the three sections. A typical high power current sink 706 is designed to provide a large but precise amount of driven current (100 mA or more) but is relatively slow to react, dissipates a large amount of heat, and cannot withstand the presentation of 100 volts or more. The smaller, active clamp current sink 704 is a circuit with a smaller MOSFET, designed only to maintain a maximum voltage at a particular point. It is generally only able to provide a much smaller current, but is designed to have a faster reaction time, and its smaller current leads to less heat dissipation. As a result, multiple active clamp current sinks can be carefully designed into one integrated circuit; whereas the heat dissipation of the MOSFET devices of the high power current sinks 706 generally require those devices to be external to any integrated circuit.

In a first embodiment, the strings of LEDs each have 30 LEDs, and the current required to produce the correct light output is 100 mA. The strings are powered by a high voltage power converter inside of the television, in this case a device that produces 116 volts. The three high power current sinks—again shown directly under each of the three strings of LEDs—are configured to drive 100 mA through each string. The high power current sinks receive their PWM commands from a controller elsewhere within the television, and can withstand a maximum voltage of 50 volts. When a particular string is switched on and is therefore drawing 100 mA of current, the forward voltage of the string is about 112 volts, as shown in the lower curve of FIG. 5. This results in approximately 4 volts (116-112) across the high power current sink, resulting in a power dissipation of 400 mW.

When the high power current sink is switched off, the forward voltages of the LED strings begin to collapse, and the voltage above the high power current sink begins to rise. As this happens, the active clamp current sink circuitry, monitoring the voltage, begins to draw current through the LEDs. As the high power current sink becomes completely inactive, the active clamp current sink stabilizes the voltage across the high power current sink at approximately 40 volts.

Figure 6:
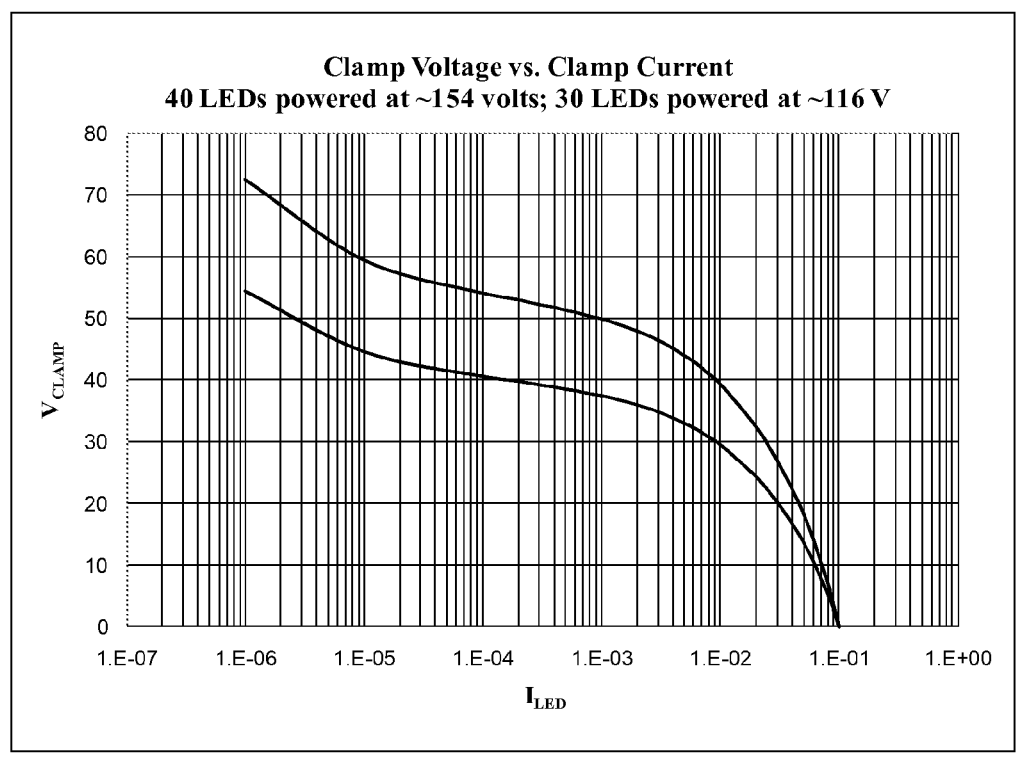
FIG. 6 is a graph of the clamp current versus the clamp voltage.

As FIG. 6 shows, this requires the active clamp current sink to draw approximately 150 µA of current. At the same 40 volts, the power dissipation across the active clamp current sink is approximately 6 mW.

Figure 5:
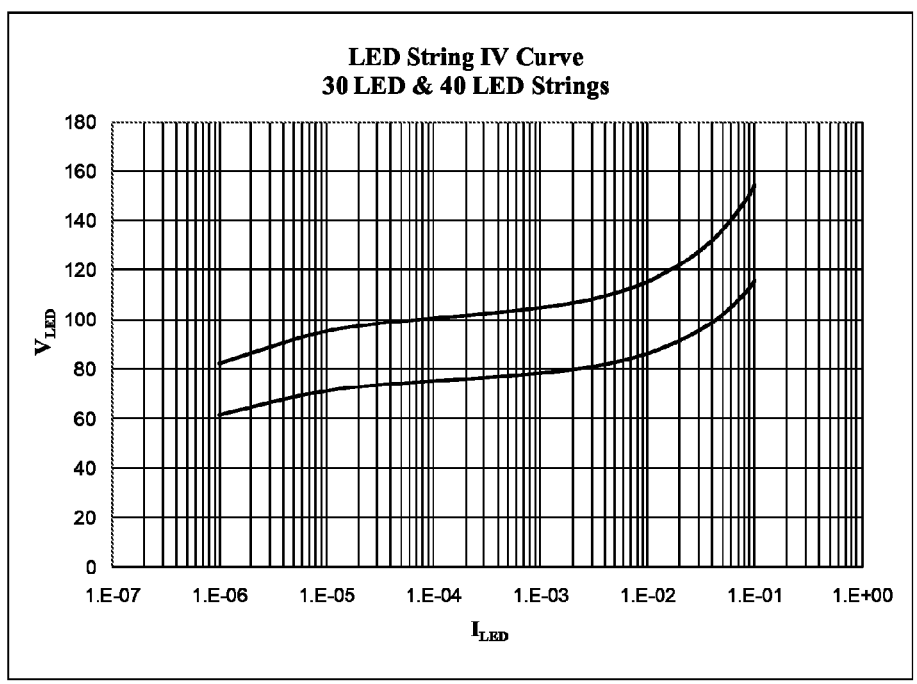
FIG. 5 is a graph of current-versus-voltage characteristic for two separate strings of LEDs.

The upper curve of FIG. 5 shows the forward voltages for a string of 40 LEDs rather than 30 LEDs. This slightly altered embodiment would include a power supply of 154 volts, rather than 116 volts. The three high power current sinks would still drive 100 mA, and the forward voltage across the string would be approximately 150 volts, as shown. This therefore results in approximately 154 volts—150 volts, or 4 volts across the high power current sink, resulting again in a power dissipation of 400 mW.

When the high power current sink is switched off and the forward voltages of the LED strings begin to collapse, and the voltage above the high power current sink begins to rise. Once again, as the high power current sink becomes completely inactive, the active clamp current sink stabilizes the voltage across the high power current sink at approximately 40 volts. As FIG. 6 shows, this requires the active clamp current sink to draw approximately 10 mA of current, quite a bit more than the previous embodiment. At the same 40 volts, the power dissipation across the active clamp current sink is therefore approximately 400 mW, about 70 times the earlier example. This shows that the current drawn and the power dissipated by the active clamp current sink is very application dependent, and that the tradeoffs of simplicity (fewer but longer strings) versus power dissipation are important considerations.

In more complex embodiments, the supply voltages would not be fixed at 116 and 154 volts; rather, a feedback mechanism within the circuit would measure the voltages across each of the high power current sinks and then use a barely sufficient supply voltage. Such a supply voltage would ensure that the each of the high power current sinks were powered via sufficient voltage. Such a scheme would require a method for determining the lowest measured voltage across all of the supply voltages in the enclosing appliance.

Figure 8:
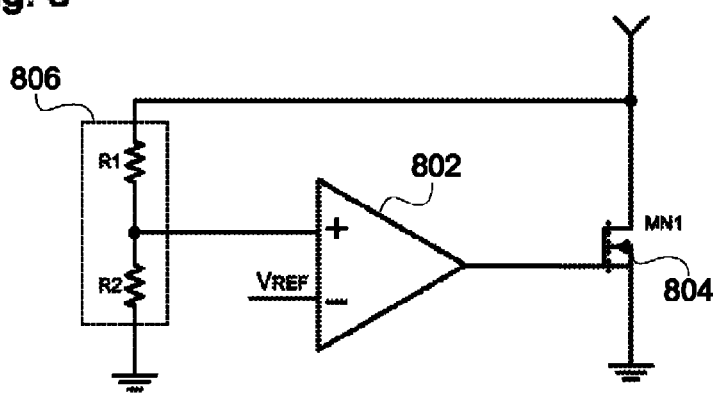
FIG. 8 is a schematic of an embodiment of the active clamp current sink.

FIG. 8 illustrates the basic layout of the operational amplifier circuitry that is part of the active clamp current sink. The operational amplifier 802 monitors the voltage on top of its MOSFET (which corresponds to the same voltage present above the high power current sink), adjusting the MOSFET MN 804, in order to regulate the bypass current. The clamp circuit conducts current in order to maintain the voltage above the MOSFET at a level equal to the set point defined by the resistor divider 806 and VREF. As the voltage above the MOSFET falls as the high power current sink begins to conduct current, the active clamp current sink reduces its powered current to nothing.

Figure 9:
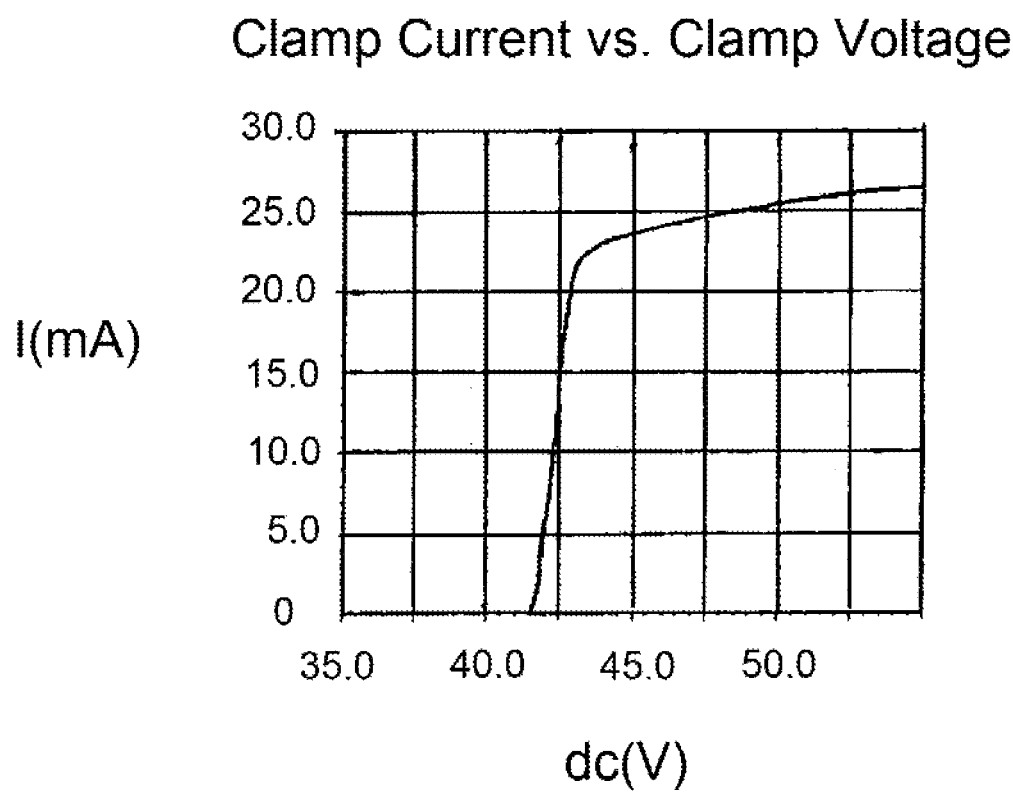
FIG. 9 shows a typical high gain clamp characteristic of the invention's operation.

FIG. 9 shows a typical high gain clamp characteristic. When the divided down voltage of FIG. 8 reaches VREF (approximately 41.7 volts) a large amount of current flows. When the voltage is less than VREF, no appreciable current flows. In the case illustrated, 1 mA flows when the voltage is 41.7 v, and the current increases relatively rapidly as the voltage increases.

Figure 1:
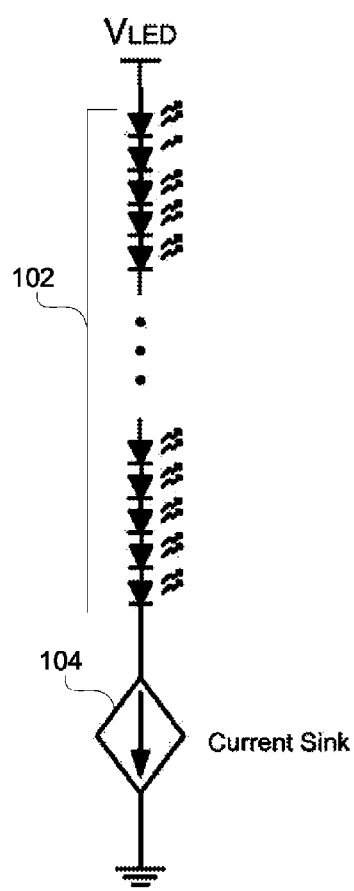
FIG. 1 is a schematic of a current sink powering a serially connected string of LEDs.
Figure 2:
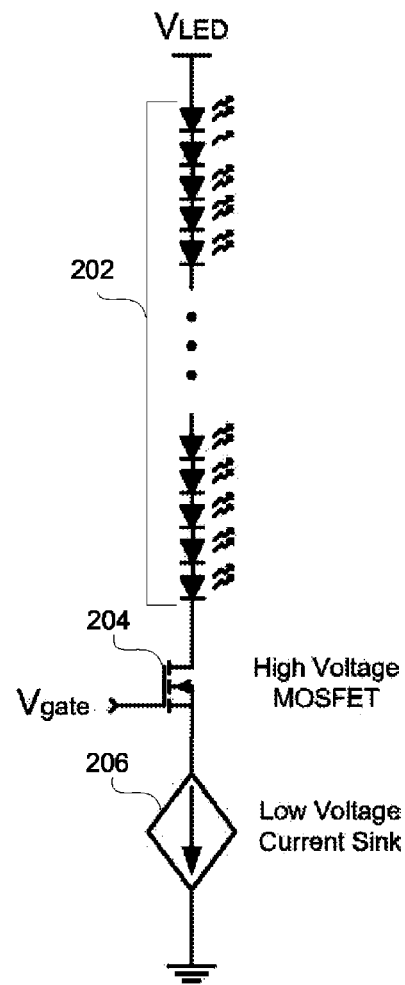
FIG. 2 is a schematic of current sink powering a serially connected string of LEDs wherein the current sink is protected by a high voltage MOSFET.
Figure 3:
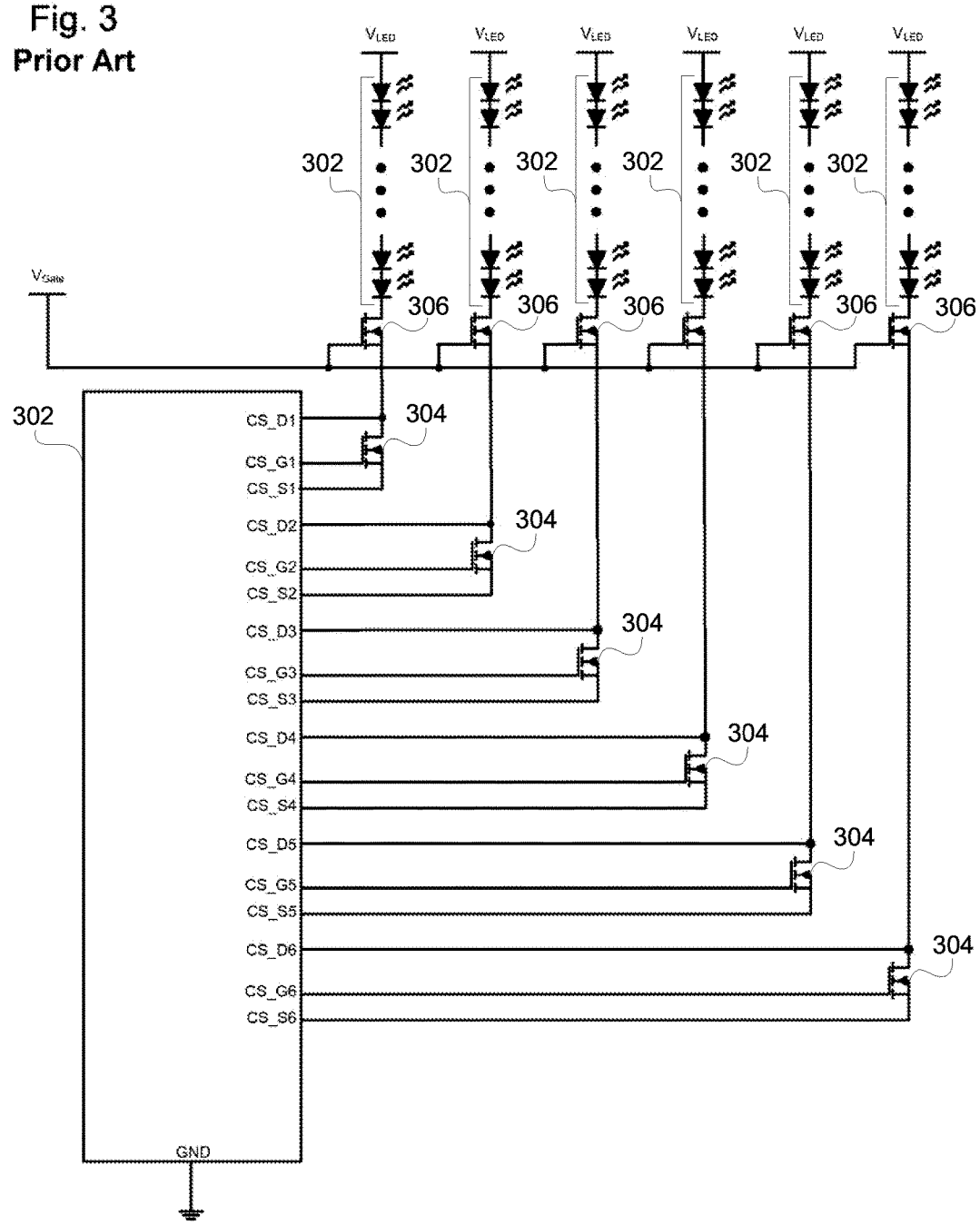
FIG. 3 is a schematic of a prior art LED backlight control circuit.
Figure 4:
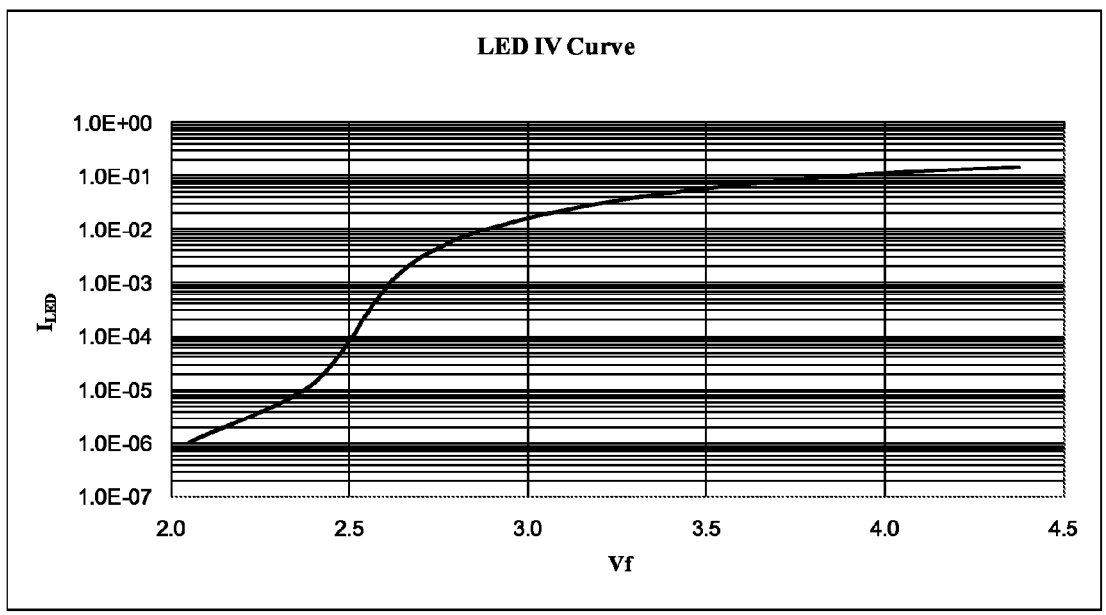
FIG. 4 is a graph of current-versus-voltage characteristic for one LED taken from laboratory measurements.

FIG. 10 shows a six channel embodiment of the invention as represented by the control circuitry of one integrated circuit 1002. The analogous prior art is shown in FIG. 3. In this embodiment, the same 30 LED strings 1004 are used as in the first embodiment, above. The six high power current sinks 1006, dissipating 640 mW each during the PWM on times, are external to the integrated circuit, while the basic circuitry of the six active clamp current sinks are internal to the integrated circuit 1002. (For brevity's sake, only one active clamp current sink 1008 is shown on the drawing.)

This figure does not show the circuitry internal to the integrated circuit 1002 that alters the gate pin of the external MOSFET, part of the high power current sink, as such circuitry would be dependent on the specifics of the application to which the embodiment is applied. One such sub-circuit could take simple on-off commands from an external controller that contained PWM logic. A more complex such sub-circuit could itself contain the PWM circuitry, and therefore take as an input the on-time percentage, or even a PWM rate and an on-time percentage.

In some embodiments, the different channels of the circuit could operate independently, with different on-time percentages, allowing the television to set different darkness levels for different areas of the LED lit screen. In these cases, the PWM mechanism 1012 could be external to the integrated circuit 1002, in which case the six channels are "switched on" and "switched off" independently, or the PWM mechanism 1010 could be internal to the integrated circuit 1002, wherein the six channels are simply given individual on-time percentages.

In a refinement to the preceding embodiments, the supply voltage itself can be regulated to provide a minimally sufficient voltage for both the LED strings and the high power current sinks to operate. In such an arrangement, a feedback mechanism would exist between the integrated circuit described as part of the preceding embodiments and the circuit that provides and regulates the power to the LED strings. The voltage measurement that the embodiments' integrated circuits use to maintain a maximum voltage level across the high power current sink could also be used by the television's regulated power supply in order to ensure that this voltage is also minimally sufficient to power the current sink. Thus, the voltage measurement is used to power the high power current sinks when they are on, and to protect the high power current sinks when they are off.

In a more complex feedback regulated embodiment, the integrated circuits themselves could be daisy chained together, allowing (in the case of the previously described embodiment) the control of 12 or 18 channels rather than 6 via shared communications. Each integrated circuit could monitor its set of voltages, control its active clamp current sinks from those observations, and pass information along about those observations. For example, in a television where the supply voltage is regulated to provide a minimally sufficient voltage, passing along the "lowest observed high power current sink voltage" would allow the supply voltage regulation circuitry to regulate to that "lowest voltage," thereby minimizing dissipated heat. In a television with 18 high voltage strings of LEDs, three daisy chained six channel integrated circuits could ensure that the lowest voltage across any active high power current sink always exceeded the 1.0 volts required for the high power current sink to be operational.

What is claimed is:

1. An integrated circuit for controlling one or more LED strings, each of the one or more LED strings having an anode connected to a power supply and a cathode, the integrated circuit comprising:
   a first pin constructed to connect to a source terminal of an external MOSFET separate from the integrated circuit;
   a second pin constructed to connect to a gate terminal of the external MOSFET;
   a third pin constructed to connect to a drain terminal of the external MOSFET and the cathode of each LED string of the one or more LED strings; and
   an active clamp current sink including an internal MOSFET and an amplifier, the active clamp current sink configured to maintain a voltage level at the cathode of each LED string of the one or more LED strings below a maximum voltage of the external MOSFET during periods of time in which the external MOSFET is turned off by shunting current away from the external MOSFET and through the internal MOSFET.

2. The integrated circuit of claim 1 wherein the internal MOSFET has a source terminal connected to a ground node, a drain terminal connected to the third pin, and a gate terminal.

3. The integrated circuit of claim 2 wherein the amplifier is an operational amplifier having a first input, a second input, and an output connected to the gate terminal of the internal MOSFET.

4. The integrated circuit of claim 3 wherein the active clamp current sink further includes a resistor divider connected between the first input of the operational amplifier and the third pin.

5. The integrated circuit of claim 3 wherein the second input of the operational amplifier is constructed to receive a voltage reference signal.

6. The integrated circuit of claim 1 wherein the active clamp current sink is constructed to maintain the voltage level at the third pin below a predefined threshold.

7. The integrated circuit of claim 1 wherein the integrated circuit is included in a television.

8. A circuit comprising:
   one or more LED strings each having an anode and a cathode, the anode being constructed to connect to a power supply;
   at least one high power current sink connected to the cathode of a respective LED string of the one or more LED strings; and
   at least one active clamp current sink connected in parallel with the at least one high power current sink, each active clamp current sink including a MOSFET and an amplifier and constructed to maintain a voltage level at the cathode of the respective LED string below a maximum voltage of the at least one high power current sink during periods of time in which the at least one high power current sink is turned off by shunting current away from the at least one high power current sink and through the MOSFET.

9. The circuit of claim 8 wherein the MOSFET is a first MOSFET and the at least one high power current sink includes a second MOSFET having a drain terminal connected to the cathode of the respective LED string.

10. The circuit of claim 8 wherein each MOSFET has a source terminal connected to a ground node, a drain terminal connected to the third pin, and a gate terminal.

11. The circuit of claim 10 wherein the amplifier is an operational amplifier having a first input, a second input, and an output connected to the gate terminal of the MOSFET.

12. The circuit of claim 11 wherein each active clamp current sink further includes a resistor divider connected between the first input of the operational amplifier and the cathode of the respective LED string.

13. The circuit of claim 11 wherein the second input of the operational amplifier is constructed to receive a voltage reference signal.

14. The circuit of claim 8 wherein the circuit is included in a television.

15. A method of controlling one or more LED strings each having an anode and a cathode, the anode of each respective LED string being connected to a power supply, the method comprising:
- controlling a current through the respective LED string using at least one high power current sink connected to the cathode of the respective LED string;
- monitoring a voltage level at the cathode of the respective LED string using at least one active clamp current sink connected in parallel with the at least one high power current sink, the active clamp current sink including a MOSFET and an amplifier; and
- shunting current away from the at least one high power current sink and through the MOSFET to maintain the voltage level at the cathode of the respective LED string below a maximum voltage of the at least one high power current sink during periods of time in which the at least one high power current sink is turned off.

16. The method of claim 15 wherein shunting the current includes shunting the current away from the at least one high power current sink and through the MOSFET responsive to comparing the voltage level at the cathode of the respective LED string with a voltage reference level.

17. The method of claim 16 wherein shunting the current away from the at least one high power current sink and through the MOSFET further includes increasing an amount of shunt current responsive to the voltage level at the cathode exceeding the voltage reference signal.

18. The method of claim 16 wherein shunting the current away from the at least one high power current sink and through the internal MOSFET further includes decreasing an amount of shunt current responsive to the voltage level at the cathode being less than the voltage reference signal.

* * * * *